(12) United States Patent
Iketani et al.

(10) Patent No.: US 8,766,275 B2
(45) Date of Patent: Jul. 1, 2014

(54) COMPOSITE SEMICONDUCTOR DEVICE

(75) Inventors: Naoyasu Iketani, Osaka (JP); Tomohiro Nozawa, Osaka (JP); Yoshiaki Nozaki, Osaka (JP); John K. Twynam, Osaka (JP); Hiroshi Kawamura, Osaka (JP); Keiichi Sakuno, Osaka (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 13/574,993

(22) PCT Filed: Dec. 28, 2010

(86) PCT No.: PCT/JP2010/073691
§ 371 (c)(1),
(2), (4) Date: Jul. 24, 2012

(87) PCT Pub. No.: WO2011/089837
PCT Pub. Date: Jul. 28, 2011

(65) Prior Publication Data
US 2012/0292635 A1 Nov. 22, 2012

(30) Foreign Application Priority Data

Jan. 25, 2010 (JP) ................... 2010-013083
Aug. 17, 2010 (JP) ................... 2010-182165

(51) Int. Cl.
*H01L 31/0256* (2006.01)
(52) U.S. Cl.
USPC ............ 257/76; 257/379; 257/E29.089
(58) Field of Classification Search
USPC ................ 257/76, 379, E29.089
See application file for complete search history.

(56) References Cited

U.S. PATENT DOCUMENTS

| 4,678,943 | A | * | 7/1987 | Uragami et al. ........... 326/58 |
| 6,434,019 | B2 | | 8/2002 | Baudelot et al. |
| 7,696,791 | B2 | * | 4/2010 | Hyvonen ................ 327/71 |
| 2006/0108659 | A1 | | 5/2006 | Yanagihara et al. |
| 2008/0191216 | A1 | * | 8/2008 | Machida et al. ............ 257/76 |
| 2008/0197908 | A1 | | 8/2008 | Williams |
| 2008/0253044 | A1 | | 10/2008 | Okushima |
| 2009/0191836 | A1 | * | 7/2009 | Ho ....................... 455/334 |
| 2009/0315075 | A1 | | 12/2009 | Sato |
| 2010/0127277 | A1 | * | 5/2010 | Arai et al. .............. 257/77 |

FOREIGN PATENT DOCUMENTS

| CN | 101286509 A | 10/2008 |
| JP | 2006-156457 A | 6/2006 |
| JP | 2006-237430 A | 9/2006 |
| JP | 2008-263088 A | 10/2008 |
| JP | 2006-324839 A | 11/2008 |
| JP | 2010-3959 A | 1/2010 |

* cited by examiner

*Primary Examiner* — Phuc Dang
(74) *Attorney, Agent, or Firm* — Birch, Stewart, Kolasch & Birch, LLP

(57) ABSTRACT

This composite semiconductor device has a normally-on first field effect transistor and a normally-off second field effect transistor connected in series between first and second terminals, gates of the first and second field effect transistors being connected to second and third terminals, respectively, and N diodes being connected in series in a forward direction between a drain and a source of the second field effect transistor. Therefore, a drain-source voltage (Vds) of the second field effect transistor can be restricted to a voltage not higher than a withstand voltage of the second field effect transistor.

12 Claims, 12 Drawing Sheets

FIG.8
(a) COMMON MATERIAL
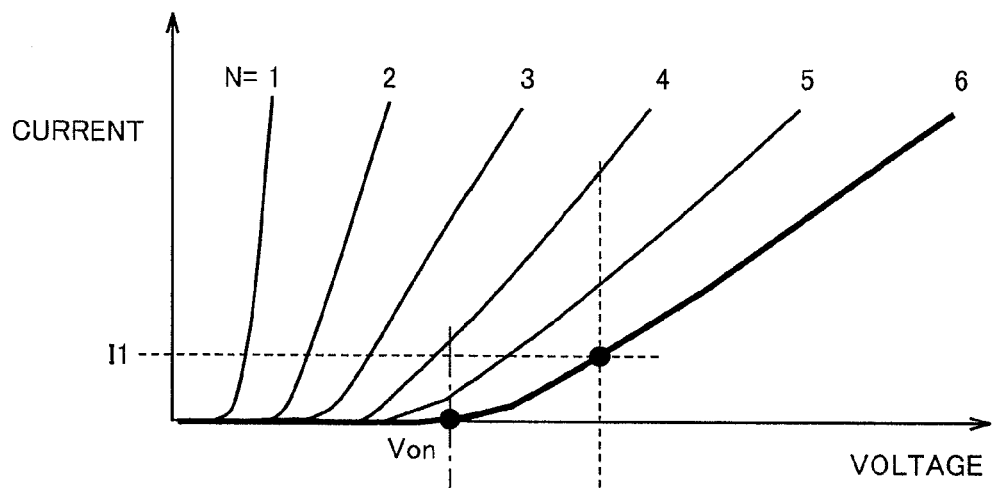
(b) WIDE BAND-GAP MATERIAL
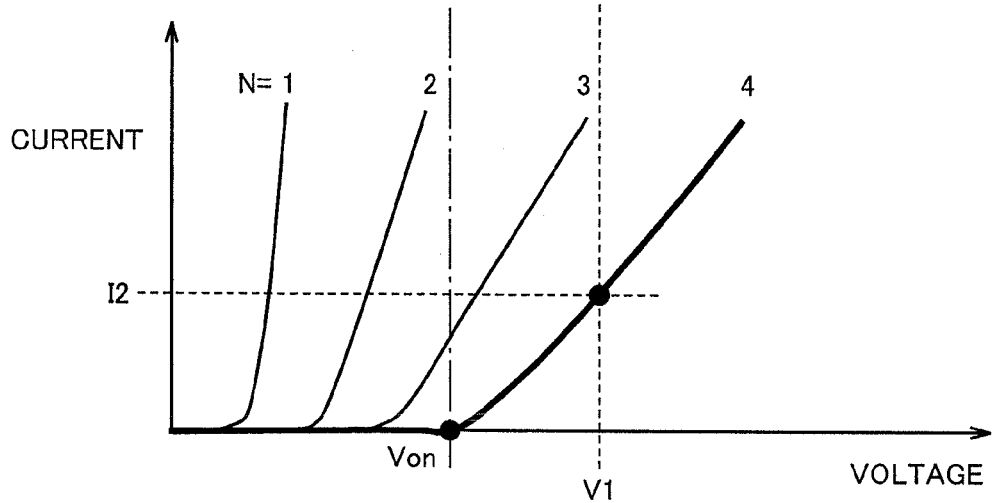

COMPOSITE SEMICONDUCTOR DEVICE

TECHNICAL FIELD

This invention relates to a composite semiconductor device, and particularly to a composite semiconductor device including a normally-on field effect transistor and a normally-off field effect transistor connected in series.

BACKGROUND ART

An Si (silicon)-based field effect transistor mainly used in a current semiconductor device is of a normally-off type. A normally-off field effect transistor is such a transistor as being rendered conductive when a positive voltage is applied across a gate and a source and being rendered non-conductive when a positive voltage is not applied across the gate and the source.

Meanwhile, a GaN (gallium nitride)-based field effect transistor for which researches for practical use have been advanced in order to achieve such characteristics as a high withstand voltage, low loss, high-speed switching, and an operation at a high temperature, is of a normally-on type. A normally-on field effect transistor has a negative threshold voltage, and it is rendered non-conductive when a gate-source voltage is lower than a threshold voltage and rendered conductive when a gate-source voltage is higher than a threshold voltage.

When such a normally-on field effect transistor is used in a semiconductor device, various problems such as use of a conventional gate drive circuit being not permitted arise. Then, it has been proposed to connect a normally-on first field effect transistor and a normally-off second field effect transistor to each other in series to configure a normally-off composite semiconductor device.

Further, in order to prevent the normally-off second field effect transistor from breaking down due to a drain-source voltage of the second field effect transistor becoming high, there is also a method of connecting a Zener diode between the drain and the source of the second field effect transistor so as to restrict a drain-source voltage to a voltage not higher than a withstand voltage of the second field effect transistor (see, for example, Japanese Patent Laying-Open No. 2006-324839 (PTL 1)).

CITATION LIST

Patent Literature

PTL 1: Japanese Patent Laying-Open No. 2006-324839

SUMMARY OF INVENTION

Technical Problem

In a conventional composite semiconductor device, however, an operation speed of a Zener diode is low and hence a drain-source voltage of the second field effect transistor becomes higher than a withstand voltage and the second field effect transistor may break down.

Therefore, a primary object of this invention is to provide a composite semiconductor device capable of preventing a normally-off field effect transistor from breaking down.

Solution to Problem

A composite semiconductor device according to this invention includes a first terminal receiving a first voltage, a second terminal receiving a second voltage lower than the first voltage, a third terminal selectively provided with any one of a third voltage and a fourth voltage higher than the third voltage, a normally-on first field effect transistor having a drain connected to the first terminal and a gate connected to the second terminal, a normally-off second field effect transistor having a drain connected to a source of the first field effect transistor, a source connected to the second terminal, and a gate connected to the third terminal, rendered non-conductive when the third voltage is provided to the third terminal, and rendered conductive when the fourth voltage is provided to the third terminal, and N (N being a natural number) unipolar rectifier elements connected in series between the drain and the source of the second field effect transistor in a forward direction and rendered conductive when a voltage across the drain and the source of the second field effect transistor exceeds a predetermined voltage not higher than a withstand voltage of the second field effect transistor.

Preferably, in a case where a voltage of the third terminal varies from the fourth voltage to the third voltage, a time period from start of increase in voltage across the drain and the source of the second field effect transistor until conduction of the N unipolar rectifier elements is set to at most half a time period from start of increase in voltage across the drain and the source of the second field effect transistor until non-conduction of the first field effect transistor.

Further preferably, each of the N unipolar rectifier elements is a Schottky diode.

Further preferably, each of the N unipolar rectifier elements is formed of a material greater in energy band gap than Si.

Further preferably, the material is $Al_xGa_{1-x}N$ ($0 \leq x \leq 1$), SiC, diamond, $Al_xGa_{1-x}As$ ($0 \leq x \leq 1$), $In_xGa_{1-x}P$ ($0 \leq x \leq 1$), or $Al_xIn_yGa_{1-x-y}N$ ($0 \leq x \leq 1$, $0 \leq y \leq 1$, $0 \leq x+y \leq 1$).

Further preferably, the composite semiconductor device includes a first semiconductor chip including first and second nitride-based semiconductor layers successively stacked on a first semiconductor substrate. The N Schottky diodes are formed in N regions on a surface of the first semiconductor chip, respectively, and an anode electrode and a cathode electrode of a corresponding Schottky diode are provided at a distance from each other in each region. A recess portion penetrating the second nitride-based semiconductor layer and reaching the first nitride-based semiconductor layer is formed in each region, the anode electrode is formed in the recess portion, and the cathode electrode is formed on a surface of the second nitride-based semiconductor layer.

Further preferably, the composite semiconductor device includes a second semiconductor chip including third and fourth nitride-based semiconductor layers successively stacked on a second semiconductor substrate. The first field effect transistor is formed on a surface of the second semiconductor chip, a gate electrode, a source electrode, and a drain electrode of the first field effect transistor are formed on a surface of the fourth nitride-based semiconductor layer, and the gate electrode is provided between the source electrode and the drain electrode.

Further preferably, the third nitride-based semiconductor layer is formed of GaN, and the fourth nitride-based semiconductor layer is formed of $Al_xGa_{1-x}N$ ($0 < x \leq 1$).

Further preferably, the composite semiconductor device includes a semiconductor chip including first and second nitride-based semiconductor layers successively stacked on a semiconductor substrate. The N Schottky diodes are formed in N first regions on a surface of the semiconductor chip, respectively, and the first field effect transistor is formed in a second region on the surface of the semiconductor chip. An anode electrode and a cathode electrode of a corresponding Schottky diode are provided at a distance from each other in each first region, a recess portion penetrating the second nitride-based semiconductor layer and reaching the first nitride-based semiconductor layer is formed in each first region, the anode electrode is formed in the recess portion, and the cathode electrode is formed on a surface of the second nitride-based semiconductor layer. A gate electrode, a source electrode, and a drain electrode of the first field effect transistor are formed on the surface of the second nitride-based semiconductor layer in the second region, and the gate electrode is provided between the source electrode and the drain electrode.

Further preferably, the first nitride-based semiconductor layer is formed of GaN, and the second nitride-based semiconductor layer is formed of $Al_xGa_{1-x}N$ ($0<x\leq1$).

Further preferably, the composite semiconductor device further includes a first resistor element interposed between the gate of the first field effect transistor and the second terminal.

Further preferably, the composite semiconductor device further includes a second resistor element interposed between the first terminal and the drain of the first field effect transistor.

Advantageous Effects of Invention

In the composite semiconductor device according to this invention, N diodes are connected in series in a forward direction between the drain and the source of the normally-off second field effect transistor and the voltage across the drain and the source of the second field effect transistor is restricted to a voltage not higher than a withstand voltage of the second field effect transistor. Therefore, since an operation speed of the diode is sufficiently higher than an operation speed of a Zener diode, the second field effect transistor can be prevented from breaking down.

BRIEF DESCRIPTION OF DRAWINGS

FIG. 8 is a diagram for illustrating an effect of the invention of the present application.

DESCRIPTION OF EMBODIMENTS

[First Embodiment]

Figure 1:
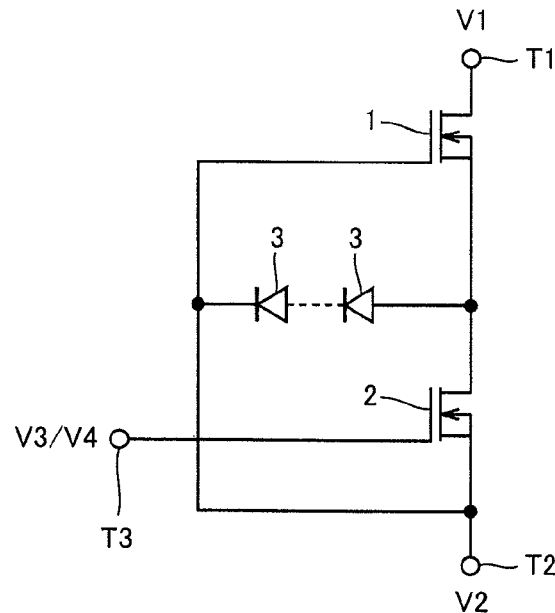
FIG. 1 is a circuit diagram showing a configuration of a composite semiconductor device according to a first embodiment of this invention.

As shown in FIG. 1, a composite semiconductor device according to the first embodiment of the present application includes a drain terminal T1, a source terminal T2, a gate terminal T3, a normally-on field effect transistor 1, a normally-off field effect transistor 2, and N (N being a natural number) diodes 3.

A supply voltage V1 is applied to drain terminal T1, and a supply voltage V2 (for example, a ground voltage) lower than supply voltage V1 is applied to source terminal T2. Any of a voltage V3 at an "L" level and a voltage V4 (>V3) at an "H" level is selectively applied to gate terminal T3.

Normally-on field effect transistor 1 has a drain connected to drain terminal T1 and a gate connected to source terminal T2. Transistor 1 is formed, for example, of GaN, and it has a negative threshold voltage VTH1. Transistor 1 is rendered non-conductive when a gate-source voltage is lower than voltage VTH1 and rendered conductive when the gate-source voltage is higher than VTH1.

Normally-off field effect transistor 2 has a drain connected to a source of transistor 1, a source connected to source terminal T2, and a gate connected to gate terminal T3. Transistor 2 is, for example, an N-channel MOS transistor formed of Si, and it has a positive threshold voltage VTH2. Transistor 2 is rendered non-conductive when a gate-source voltage is lower than VTH2 and rendered conductive when the gate-source voltage is higher than VTH2.

A difference (V3−V2) between voltage V3 at the "L" level applied to gate terminal T3 and supply voltage V2 applied to source terminal T2 is set to a voltage lower than threshold voltage VTH2 of transistor 2. Therefore, when voltage V3 at the "L" level is applied to gate terminal T3, transistor 2 is rendered non-conductive.

Meanwhile, a difference (V4−V2) between voltage V4 at the "H" level applied to gate terminal T3 and supply voltage V2 applied to source terminal T2 is set to a voltage higher than threshold voltage VTH2 of transistor 2. Therefore, when voltage V4 at the "H" level is applied to gate terminal T3, transistor 2 is rendered conductive. It is noted that diodes may be connected in anti-parallel to each transistor 1, 2.

N diodes 3 are connected in series in a forward bias direction between the drain and the source of transistor 2. With a threshold voltage of each diode 3 being assumed as VTH3, a sum of threshold voltages of N diodes 3 (N×VTH3) is set to a prescribed voltage Vc not higher than a withstand voltage of transistor 2. Therefore, when drain-source voltage Vds of transistor 2 exceeds prescribed voltage Vc, N diodes 3 are rendered conductive together. Therefore, drain-source voltage Vds of transistor 2 is maintained to be equal to or lower than prescribed voltage Vc not higher than a withstand voltage of transistor 2 and transistor 2 is prevented from breaking down.

An operation of this composite semiconductor device will now be described. It is assumed that supply voltage V1 is applied to drain terminal T1 and supply voltage V2 is applied to source terminal T2. When voltage V4 at the "H" level is applied to gate terminal T3, transistor 2 is rendered conductive. Therefore, a gate-drain voltage of transistor 1 attains substantially to 0 V, which is higher than negative threshold voltage VTH1, and hence transistor 1 is rendered conductive. Therefore, both of transistors 1, 2 are rendered conductive, and conduction between drain terminal T1 and source terminal T2 is established.

Figure 2:
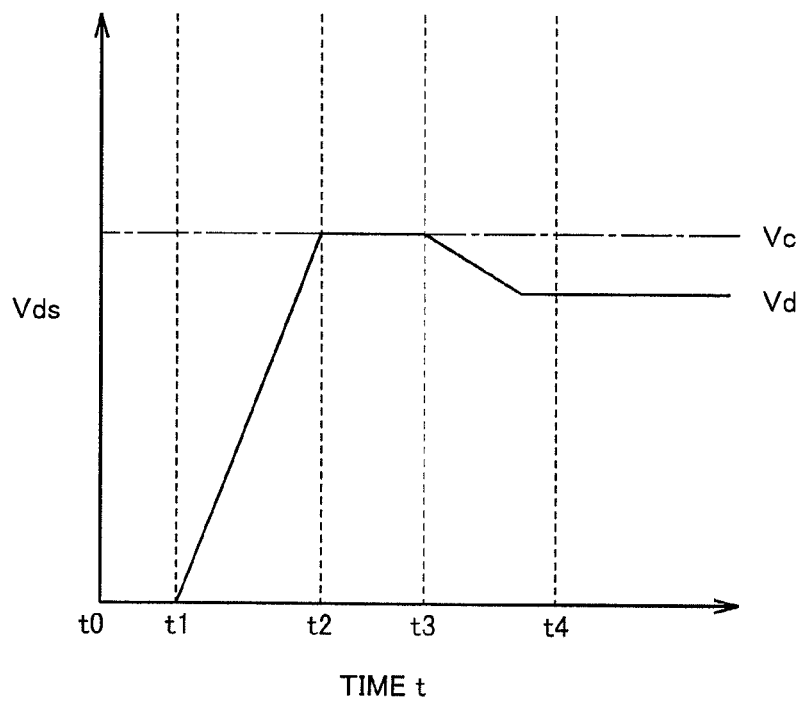
FIG. 2 is a time chart showing a drain-source voltage of the normally-on field effect transistor shown in FIG. 1.

FIG. 2 is a time chart showing drain-source voltage Vds of transistor 2 in the case where a voltage of gate terminal T3 in FIG. 1 is switched from voltage V4 at the "H" level to voltage V3 at the "L" level. At a time t0, when a voltage of gate terminal T3 is switched from voltage V4 at the "H" level to voltage V3 at the "L" level, transistor 2 is rendered non-conductive with a delay by a prescribed period of time (a time T1).

At the moment when transistor 2 is rendered non-conductive, transistor 1 is still conducting and a current flows through transistor 1. Therefore, drain-source voltage Vds of transistor 1 suddenly increases. When drain-source voltage Vds of transistor 2 attains to prescribed voltage Vc, N diodes 3 are rendered conductive and relation of Vds=Vc is satisfied (a time t2).

Since relation of −Vc<VTH1 is set, transistor 1 is rendered non-conductive with a delay by a prescribed period of time from the time point when relation of −Vds<VTH1 is satisfied (a time t3). Therefore, both of transistors 1, 2 are rendered non-conductive, and non-conduction between drain terminal T1 and source terminal T2 is established. Drain-source voltage Vds of transistor 2 attains to a voltage Vd obtained by dividing a voltage between terminals T1 and T2 (V1−V2) by resistance values of transistors 1, 2. Thus, the composite semiconductor device operates as a normally-off switching element.

Figure 3:
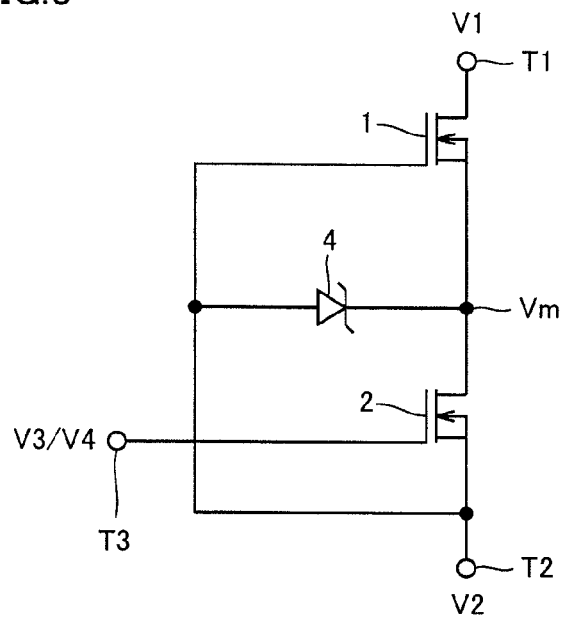
FIG. 3 is a circuit diagram showing a comparative example of the first embodiment.

FIG. 3 is a circuit diagram showing a comparative example of the first embodiment, which is compared with FIG. 1. The composite semiconductor device in FIG. 3 is different from the composite semiconductor device in FIG. 1 in that N diodes 3 are replaced with a Zener diode 4. A cathode and an anode of Zener diode 4 are connected to the drain and the source of transistor 2, respectively. A Zener voltage of Zener diode 4 is set to prescribed voltage Vc above.

Therefore, the composite semiconductor device in FIG. 3 is also considered to operate similarly to the composite semiconductor device in FIG. 1. A response speed of Zener diode 4, however, is quite lower than a response speed of diode 3. Thus, even though drain-source voltage Vds of transistor 2 suddenly increases to exceed prescribed voltage Vc, Zener diode 4 is not rendered conductive and transistor 2 may break down.

Figure 4:
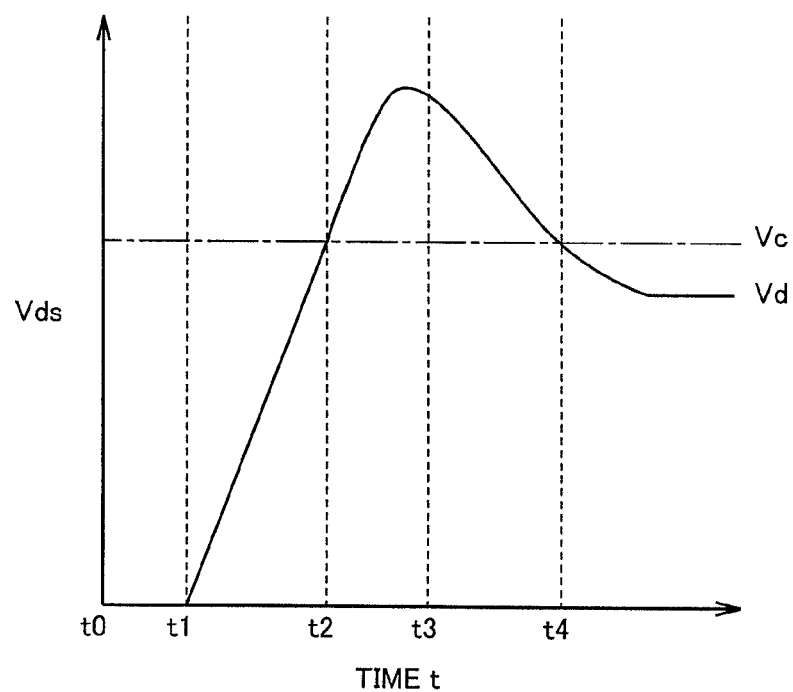
FIG. 4 is a time chart showing a drain-source voltage of the normally-on field effect transistor shown in FIG. 3.

FIG. 4 is a time chart showing drain-source voltage Vds of transistor 2 in the case where a voltage of gate terminal T3 in FIG. 3 is switched from voltage V4 at the "H" level to voltage V3 at the "L" level, which is compared with FIG. 2. At time t0, when the voltage of gate terminal T3 is switched from voltage V4 at the "H" level to voltage V3 at the "L" level, transistor 2 is rendered non-conductive with a delay by a prescribed period of time (time t1).

At the moment when transistor 2 is rendered non-conductive, transistor 1 is still conducting and a current flows through transistor 1. Therefore, drain-source voltage Vds of transistor 2 suddenly increases. Even when drain-source voltage Vds of transistor 2 attains to prescribed voltage Vc, Zener diode 4 does not yet operate and drain-source voltage Vds of transistor 2 exceeds prescribed voltage Vc (time t2).

Since relation of −Vc<VTH1 is set, transistor 1 is rendered non-conductive with a delay by a prescribed period of time from the time point when relation of −Vds<VTH1 is satisfied (time t3). Therefore, both of transistors 1, 2 are rendered non-conductive, and non-conduction between drain terminal T1 and source terminal T2 is established. Thereafter, Zener diode 4 operates (a time t4), and drain-source voltage Vds of transistor 2 attains to voltage Vd obtained by dividing a voltage between terminals T1, T2 (V1−V2) by resistance values of transistors 1, 2.

Therefore, in the composite semiconductor device in FIG. 3, since a response speed of Zener diode 4 is low, drain-source voltage Vds of transistor 2 exceeds prescribed voltage Vc and transistor 2 may break down. In contrast, according to the invention of the present application, since a response speed of diode 3 is high, drain-source voltage Vds of transistor 2 is restricted to be not higher than prescribed voltage Vc and transistor 2 will not break down.

Figure 5:
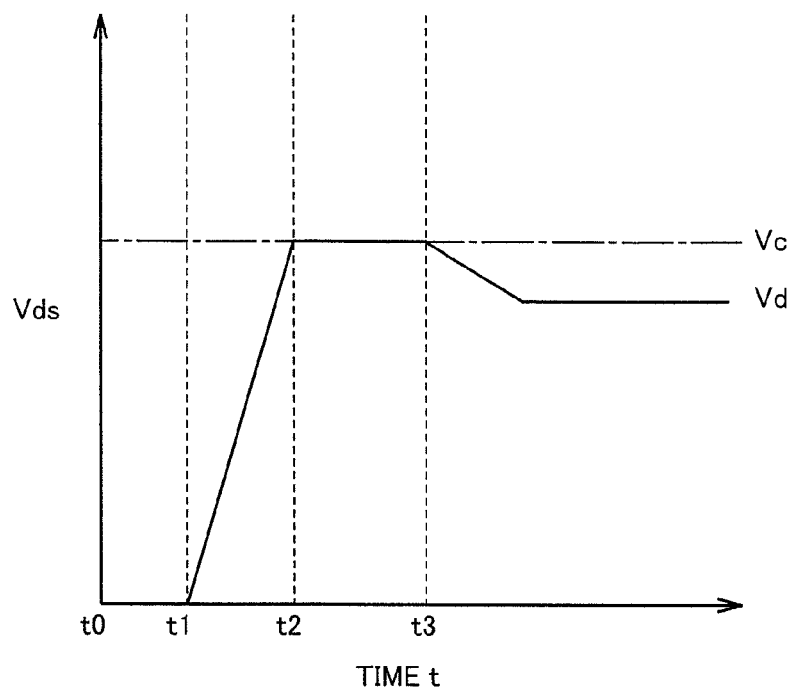
FIG. 5 is a time chart showing a modification of the first embodiment.

As shown in FIG. 5, a time period from start of increase in drain-source voltage Vds of transistor 2 until conduction of N diodes 3 (t2-t1) is preferably set to at most half a time period from start of increase in drain-source voltage Vds of transistor 2 until non-conduction of transistor 1 (t3-t1). This setting can be made, for example, by adjusting prescribed voltage Vc, that is, the sum of the threshold voltages of N diodes 3 (N×VTH3). With such setting, transistor 2 can reliably be prevented from breaking down due to drain-source voltage Vds of transistor 2 exceeding a withstand voltage of transistor 2.

[Second Embodiment]

Figure 6:
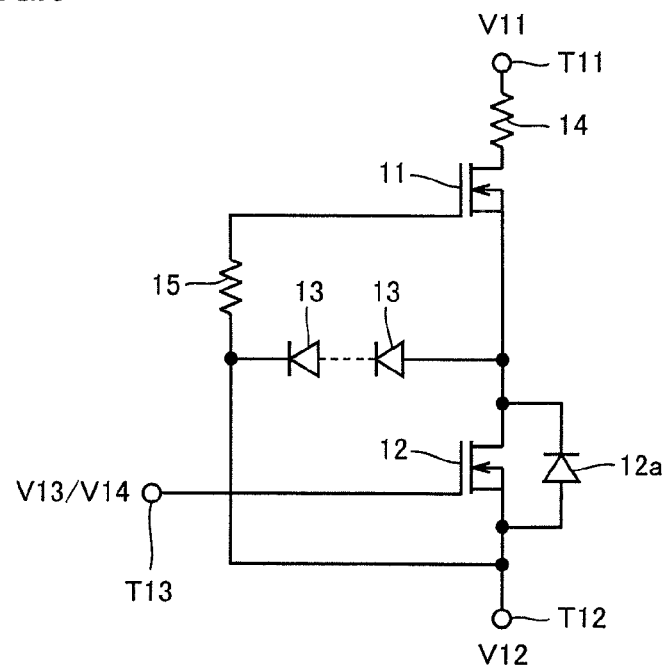
FIG. 6 is a circuit diagram showing a configuration of a composite semiconductor device according to a second embodiment of this invention.

As shown in FIG. 6, a composite semiconductor device according to the second embodiment of the present application includes a drain terminal T11, a source terminal T12, a gate terminal T13, a normally-on field effect transistor 11, a normally-off field effect transistor 12, N (N being a natural number, such as 4) diodes 13, and resistor elements 14, 15.

A supply voltage V11 (150 V) is applied to drain terminal T11 and a ground voltage V12 (0 V) is applied to source terminal T12. Any one of a voltage V13 (0 V) at the "L" level and a voltage V14 (10 V) at the "H" level is selectively applied to gate terminal T3.

Normally-on field effect transistor 11 has a drain connected to one electrode of resistor element (load resistance) 14 and resistor element 14 has the other electrode connected to drain terminal T11. Resistor element 14 has a resistance value of 141Ω. Transistor 11 has a gate connected to source terminal T12 with resistor element (gate resistance) 15 being interposed. Resistor element 15 has a resistance value of 10Ω. Transistor 11 has a negative threshold voltage VTH11 (−3 V). Transistor 11 is rendered non-conductive when a gate-source voltage is lower than VTH11 and rendered conductive when the gate-source voltage is higher than VTH11.

Normally-off field effect transistor 12 has a source connected to source terminal T12, a drain connected to a source of transistor 11, and a gate connected to gate terminal T13. Transistor 12 has a positive threshold voltage VTH12 (÷2 V). Transistor 12 is rendered non-conductive when a gate-source voltage is lower than VTH12 and rendered conductive when the gate-source voltage is higher than VTH12. Therefore, when voltage V13 at the "L" level is applied to gate terminal T13, transistor 12 is rendered non-conductive. Alternatively, when voltage V14 at the "H" level is applied to gate terminal T13, transistor 12 is rendered conductive. It is noted that transistor 12 contains a parasitic diode. In FIG. 6, a parasitic diode is shown as a diode 12a connected between the source and the drain of transistor 12.

N diodes 13 are connected in series in a forward bias direction between the drain and the source of transistor 12. With a threshold voltage of each diode 13 being assumed as VTH13, a sum of threshold voltages of N diodes 13 (N×VTH13=4.1 V) is set to a prescribed voltage Vc1 not higher than a withstand voltage of transistor 12. Therefore, when drain-source voltage Vds of transistor 12 exceeds prescribed voltage Vc1, N diodes 13 are rendered conductive together. Therefore, drain-source voltage Vds of transistor 12 is maintained to be equal to or lower than prescribed voltage Vc1 not higher than a withstand voltage of transistor 12 and transistor 12 is prevented from breaking down.

Here, with a withstand voltage of transistor 12 being denoted as Va, in order to prevent breakdown of transistor 12, it is essential that relation of N≤Va/VTH13 is satisfied. In addition, it is desirable that relation of Va/VTH13≤2N is satisfied. This is because a withstand voltage of transistor 12 and an ON resistance value have trade-off relation and hence increase in withstand voltage of transistor 12 more than necessary leads to lowering in characteristics of a composite semiconductor device.

An operation of this composite semiconductor device will now be described. It is assumed that supply voltage V11 is applied to drain terminal T11 and ground voltage V12 is applied to source terminal T12. When voltage V14 at the "H" level is applied to gate terminal T13, transistor 12 is rendered conductive. Therefore, a gate-drain voltage of transistor 11 attains substantially to 0 V, which is higher than negative threshold voltage VTH11, and transistor 11 is rendered conductive. Therefore, both of transistors 11, 12 are rendered conductive, and a current flows from source terminal T11 through resistor element 14 and transistors 11, 12 to drain terminal T12.

Then, when the voltage of gate terminal T13 is switched from voltage V14 at the "H" level to voltage V13 at the "L" level, transistor 12 is rendered non-conductive with a delay by a prescribed period of time. At the moment when transistor 12 is rendered non-conductive, transistor 11 is still conducting and a current flows through transistor 11. Therefore, drain-source voltage Vds of transistor 12 suddenly increases. When drain-source voltage Vds of transistor 12 attains to prescribed voltage Vc1, N diodes 13 are rendered conductive and relation of Vds=Vc1 is satisfied.

Since relation of −Vc1<VTH11 is set, transistor 11 is rendered non-conductive with a delay by a prescribed period of time from the time point when relation of −Vds<VTH11 is satisfied. Therefore, both of transistors 11, 12 are rendered non-conductive, and non-conduction between drain terminal T11 and source terminal T12 is established. Drain-source voltage Vds of transistor 12 attains to voltage Vd obtained by dividing a voltage between terminals T11 and T12 (V11−V12) by resistance values of resistor element 14 and transistors 11, 12. Thus, the composite semiconductor device operates as a normally-off switching element.

Figure 7:
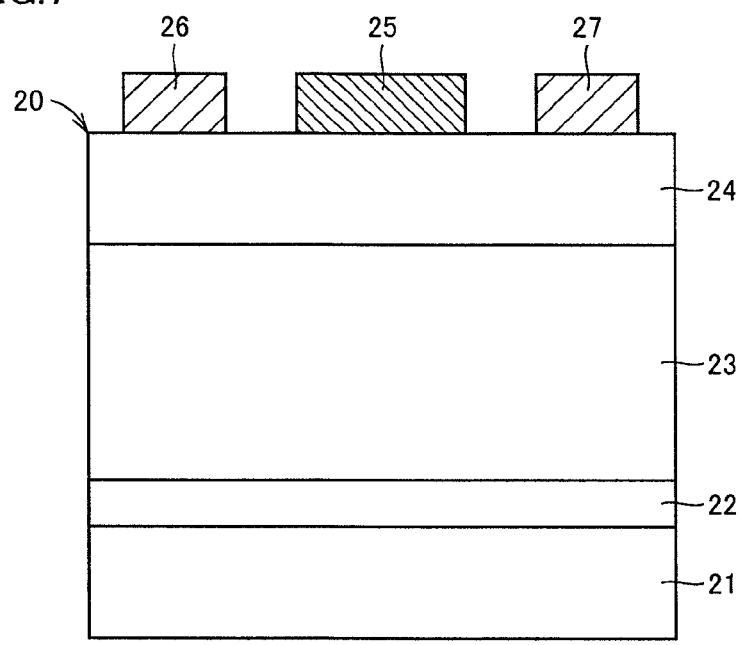
FIG. 7 is a cross-sectional view showing a structure of a semiconductor chip on which a normally-on field effect transistor shown in FIG. 6 is mounted.

Transistors 11, 12 and diode 13 will now be described further in detail. In the present second embodiment, a hetero junction field effect GaN transistor was employed as normally-on field effect transistor 11. Transistor 11 is formed on a surface of a semiconductor chip 20 as shown in FIG. 7. Semiconductor chip 20 includes a semiconductor substrate 21, a buffer layer 22, a channel layer 23, and a barrier layer 24 successively stacked on a surface thereof; and a gate electrode 25, a source electrode 26, and a drain electrode 27 formed on a surface of barrier layer 24. Gate electrode 25 is provided between source electrode 26 and drain electrode 27.

Semiconductor substrate 21 is a crystalline silicon (Si) substrate. Buffer layer 22 is formed of AlGaN. Channel layer 23 is formed of GaN. Barrier layer 24 is formed of $Al_{0.25}Ga_{0.75}N$. On a channel layer 23 side of a hetero junction plane between channel layer 23 and barrier layer 24, a channel formed of a two-dimensional electron gas is formed. Gate electrode 25 includes a WN layer and a W layer successively stacked on the surface of barrier layer 24. Gate electrode 25 and barrier layer 24 form a Schottky junction. Namely, a Schottky barrier diode is formed across gate electrode 25 and barrier layer 24.

Each of source electrode 26 and drain electrode 27 includes an Hf layer, an Al layer, an Hf layer, and an Au layer successively stacked on the surface of barrier layer 24. Each of source electrode 26 and drain electrode 27 and barrier layer 24 form a resistance junction. When a voltage across gate electrode 25 and source electrode 26 is higher than negative threshold voltage VTH11, a current flows between drain electrode 27 and source electrode 26. When a voltage across gate electrode 25 and source electrode 26 is lower than negative threshold voltage VTH11, no current flows between drain electrode 27 and source electrode 26.

An N-channel type MOS field effect transistor formed of Si was employed as normally-off field effect transistor 12.

Performance required of diode 13 is to quickly turn on when a voltage across an anode and a cathode exceeds threshold voltage VTH13. In addition, diode 13 should be inexpensive. Then, in the present second embodiment, a Schottky barrier diode was employed as diode 13.

Since a Schottky barrier diode is a unipolar rectifier element, it requires less recovery charge and loss at the time of switching is reduced. In addition, since an operation time period of a Schottky barrier diode is short, a leakage current can reliably be suppressed even when switching is fast and increase in intermediate voltage (a drain voltage of transistor 12) can be suppressed.

In addition, as a material forming a Schottky barrier diode is greater in energy band gap than Si generally used in many cases, the number N of serial parts of diode 13 can be small and dI/dV can be kept high. This is because use of a semiconductor great in energy band gap leads to further increase in difference in work function between a semiconductor and an electrode and to further increase in forward voltage at which a current starts to flow.

Alternatively, by connecting a source and a gate of a normally-off field effect transistor to each other, it can also function as a diode, that is, a unipolar rectifier element. In this case, the field effect transistor may be a low-withstand-voltage element, and if a normally-off GaN FET having a withstand voltage not lower than approximately several ten V is employed, low loss or switching at a high speed can be achieved. Furthermore, since a normally-on GaN FET and a unipolar rectifier element can be fabricated to have the same structure or can be fabricated in the same process, integration also becomes possible.

FIG. 8(a) is a diagram showing V-I characteristics of a Schottky barrier diode formed of a common material, and FIG. 8(b) is a diagram showing V-I characteristics of a Schottky barrier diode formed of a wide band-gap semiconductor material. FIG. 8(a) shows the V-I characteristics in the case where the number N of diodes connected in series was varied from 1 to 6, while FIG. 8(b) shows the V-I characteristics in the case where the number N of diodes 13 connected in series was varied from 1 to 4.

As can be seen in FIGS. 8(a) and 8(b), for turn-on at a certain voltage Von, with a diode formed of a common material, 6 diodes should be connected in series, however, with diode 13 formed of a wide band-gap material, 4 diodes 13 connected in series suffice.

When it is assumed that a current that flows when a prescribed voltage V1 (V1>Von) is applied to a string of 6 diodes connected in series and formed of a common material is denoted as I1 and a current that flows when prescribed voltage V1 is applied to a string of 4 diodes 13 connected in series and formed of a wide band-gap material is denoted as I2, relation of I2>I1 is satisfied. Therefore, diode 13 formed of a wide band-gap material is advantageous in that a current higher than in a diode formed of a common material can flow therein. In addition, the number of diodes can be smaller and reduction in cost can be achieved.

For example, such materials as $Al_xGa_{1-x}N$ ($0 \leq x \leq 1$), SiC, diamond, ZnO, $Al_xGa_{1-x}As$ ($0 \leq x \leq 1$), and $In_xGa_{1-x}P$ ($0 \leq x \leq 1$) are available as a material great in energy band gap. In addition, $Al_xIn_yGa_{1-x-y}N$ ($0 \leq x \leq 1$, $0 \leq y \leq 1$, $0 \leq x+y \leq 1$) can be greater in energy band gap than Si, by adjusting composition. It is noted that the material is not limited as above, and any material greater in energy band gap than Si may be employed.

A wide band-gap material the same as that for transistor 11 is further preferred. For example, if a material for transistor 11 is GaN, a material for diode 13 is also preferably GaN. Alternatively, if a material for transistor 11 is an AlGaN/GaN hetero material, a material for diode 13 is also preferably an AlGaN/GaN hetero material. If transistor 11 and diode 13 can be formed of the same material, a source material, a substrate, and a manufacturing apparatus for transistor 11 and diode 13 can be common, which leads to reduction in material cost or manufacturing cost.

Since a hetero junction field effect GaN transistor was employed as transistor 11 in the present second embodiment, a GaN Schottky barrier diode having a recess structure (hereinafter, referred to as a recess GaN Schottky barrier diode) is preferably employed as diode 13.

Figure 9:
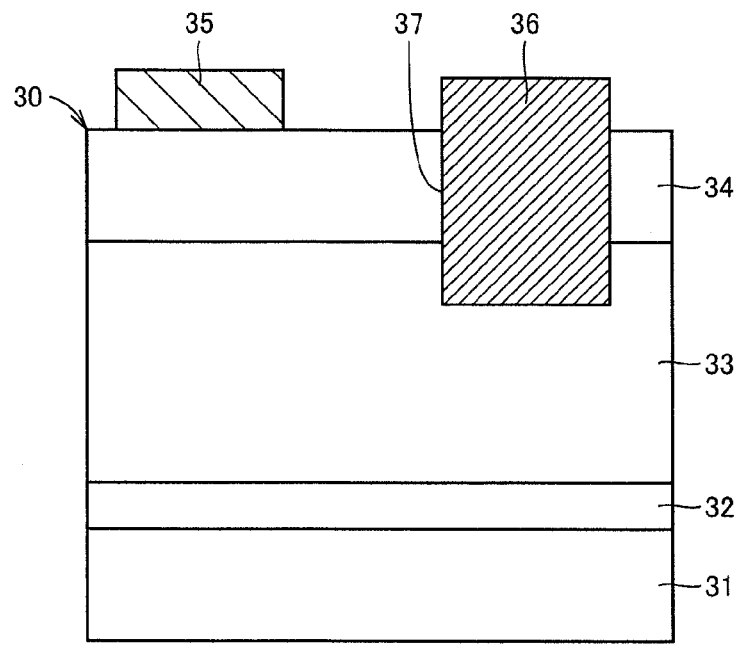
FIG. 9 is a cross-sectional view showing a structure of a semiconductor chip on which a diode 13 shown in FIG. 6 is mounted.

FIG. 9 is a cross-sectional view showing a construction of such diode 13. In FIG. 9, diode 13 is formed on a surface of a semiconductor chip 30. Semiconductor chip 30 includes a semiconductor substrate 31, a buffer layer 32, a channel layer 33, and a barrier layer 34 successively stacked on a surface thereof, and a cathode electrode 35 and an anode electrode 36 provided at a distance from each other on the surface of semiconductor chip 30.

Semiconductor substrate 31 is a crystalline silicon (Si) substrate. Buffer layer 32 is formed of AlGaN. Channel layer 33 is formed of GaN. Barrier layer 34 is formed of $Al_{0.25}Ga_{0.75}N$. On a channel layer 33 side of a hetero junction plane between channel layer 33 and barrier layer 34, a channel formed of a two-dimensional electron gas is formed. Cathode electrode 35 includes an Hf layer, an Al layer, an Hf layer, and an Au layer successively stacked on the surface of barrier layer 34. Cathode electrode 35 and barrier layer 34 form a resistance junction.

Figure 10:
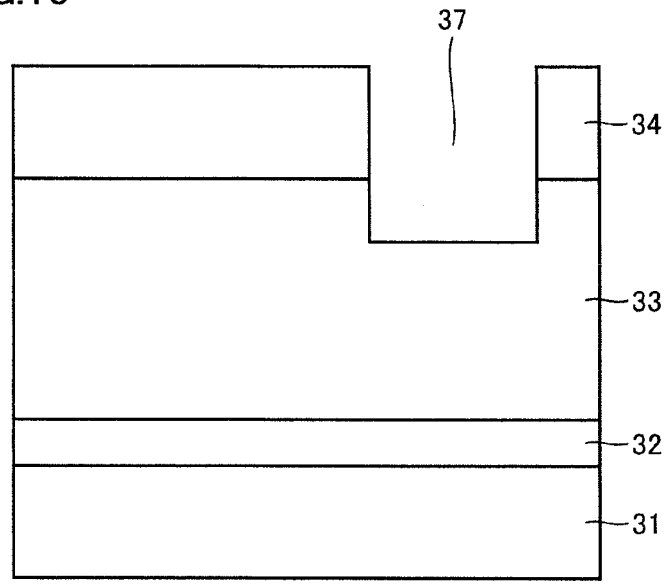
FIG. 10 is a cross-sectional view showing a method of manufacturing an anode electrode shown in FIG. 9.

Anode electrode 36 is formed in a recess portion (depressed portion) 37 formed to a prescribed depth in a prescribed region in the surface of semiconductor chip 30. Here, a method of forming anode electrode 36 will briefly be described. After buffer layer 32, channel layer 33, and barrier layer 34 are formed on the surface of semiconductor substrate 31, as shown in FIG. 10, recess portion 37 is formed by digging by a prescribed depth from a surface of barrier layer 34 to the inside of channel layer 33 in a prescribed region. Then, the WN layer is formed to cover a bottom surface and a side surface of recess portion 37 and the W layer is stacked on the WN layer. Anode electrode 36 includes the stacked WN layer and W layer. Anode electrode 36 as well as barrier layer 34 and channel layer 33 form a Schottky junction. Namely, a Schottky barrier diode is formed across anode electrode 36 and barrier layer 34. In addition, since anode electrode 36 and channel layer 33 are in contact with each other, a resistance value between anode electrode 36 and the two-dimensional electron gas formed at an interface between barrier layer 34 and channel layer 33 is lowered and an ON resistance value of diode 13 is lowered.

Figure 11:
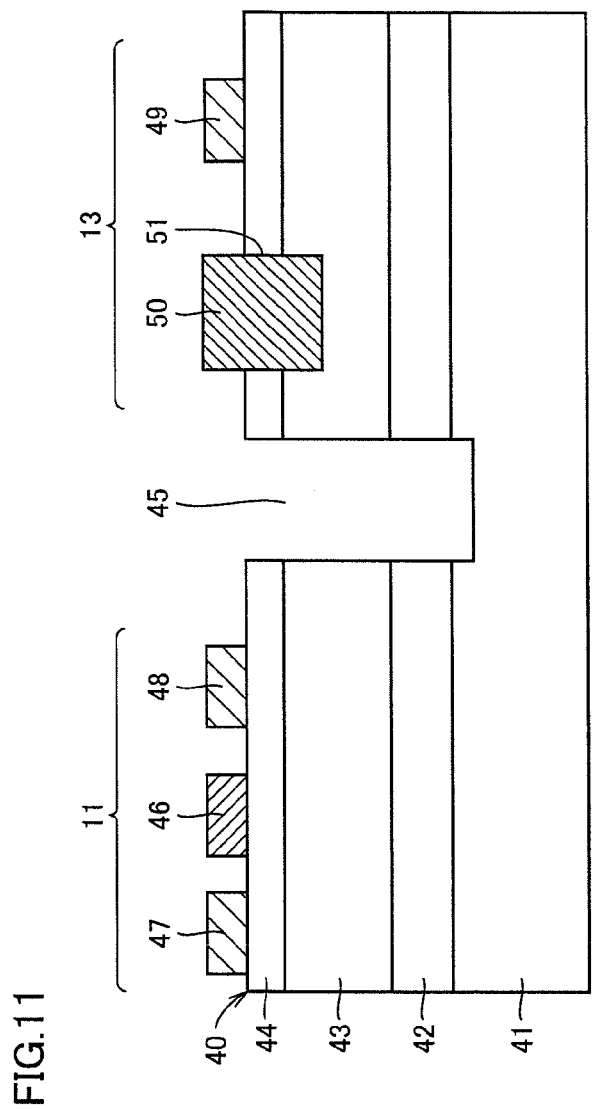
FIG. 11 is a cross-sectional view showing a structure of a semiconductor chip on which a transistor 11 and diode 13 shown in FIG. 6 are mounted.

FIG. 11 is a cross-sectional view showing a construction of a semiconductor chip on which transistor 11 and diode 13 are mounted. In FIG. 11, a semiconductor chip 40 includes a semiconductor substrate 41, and a buffer layer 42, a channel layer 43, and a barrier layer 44 successively stacked on a surface thereof. A material for each of semiconductor substrate 41, buffer layer 42, channel layer 43, and barrier layer 44 is as described with reference to FIGS. 7 and 9.

A surface of semiconductor chip 40 is divided into a transistor region and a diode region by a groove 45. Groove 45 is formed to divide a two-dimensional electron gas formed at an interface between barrier layer 44 and channel layer 43 into two parts, but not to divide semiconductor substrate 41 into two parts. As shown in FIG. 11, if a bottom of groove 45 reaches semiconductor substrate 41, a leakage current between transistor 11 and diode 13 can be decreased, which is more preferred.

In the transistor region on the left in FIG. 11, a gate electrode 46, a source electrode 47, and a drain electrode 48 of transistor 11 are provided on the surface of barrier layer 44, at a distance from one another. Gate electrode 46 is provided A7between source electrode 47 and drain electrode 48. A material for each of gate electrode 46, source electrode 47, and drain electrode 48 is as described with reference to FIG. 7.

In the diode region on the right in FIG. 11, a cathode electrode 49 and an anode electrode 50 of diode 13 are provided at a distance from each other on the surface of semiconductor chip 40. Cathode electrode 49 is formed on the surface of barrier layer 44. Anode electrode 50 is provided in a recess portion 51 dug from the surface of barrier layer 44 to the inside of channel layer 43. A material for each of cathode electrode 49 and anode electrode 50 is as described with reference to FIG. 9.

By thus mounting transistor 11 and diode 13 together on the same semiconductor chip 40, reduction in cost for a material or manufacturing in connection with effective use of a substrate area, decrease in the number of manufacturing steps, and the like can be achieved. In addition, lowering in resistance or lowering in inductance in connection with decrease in distance of interconnection is also achieved.

Though one transistor 11 and one diode 13 have been shown in FIG. 11, one transistor 11 and four diodes 13 can naturally be mounted on the same semiconductor chip 40.

Figure 12:
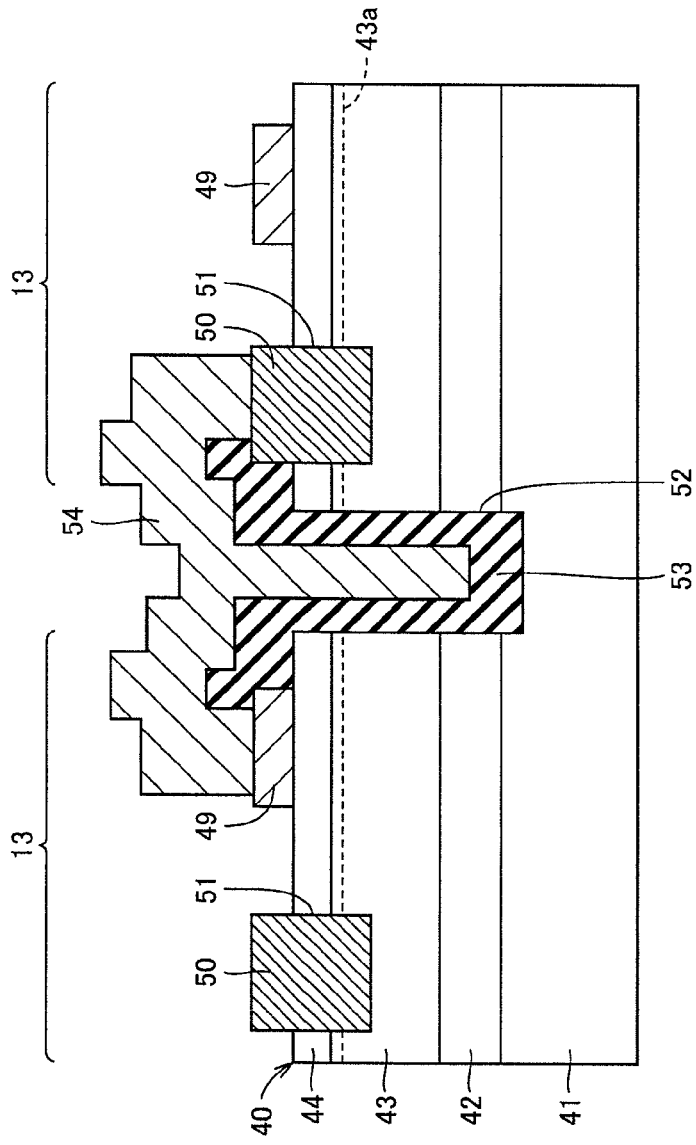
FIG. 12 is a cross-sectional view showing a structure of a semiconductor chip on which a plurality of diodes 13 shown in FIG. 6 are mounted.

FIG. 12 is a cross-sectional view showing two diodes 13 mounted on the surface of semiconductor chip 40. For simplification of illustration, FIG. 12 does not show transistor 11 and two remaining diodes 13. The surface of semiconductor chip 40 is divided into a plurality of diode regions for forming a plurality of diodes 13, respectively. Two adjacent diode regions are divided by a groove 52. A bottom of groove 52 reaches the inside of semiconductor substrate 41. A channel (two-dimensional electron gas) 43a formed under an interface between barrier layer 44 and channel layer 43 is divided by groove 52.

In the diode region on the left in FIG. 12, anode electrode 50 and cathode electrode 49 of first diode 13 are provided on the left and the right, at a distance from each other, on the surface of semiconductor chip 40. In the diode region on the right in FIG. 12, anode electrode 50 and cathode electrode 49 are provided on the left and the right, at a distance from each other, on the surface of semiconductor chip 40.

An insulating film 53 is formed to cover a region between an end portion on a groove 52 side of cathode electrode 49 of first diode 13 and an end portion on a groove 52 side of anode electrode 50 of second diode 13. A metal interconnection 54 is formed on cathode electrode 49 of first diode 13, insulating film 53, and anode electrode 50 of second diode 13. Metal interconnection 54 may be formed of a material the same as that for cathode electrode 49, may be formed of a material the same as that for anode electrode 50, or may be formed of other metal materials. Thus, two diodes 13 are connected in series. This is also the case with four diodes 13 connected in series.

Figure 13:
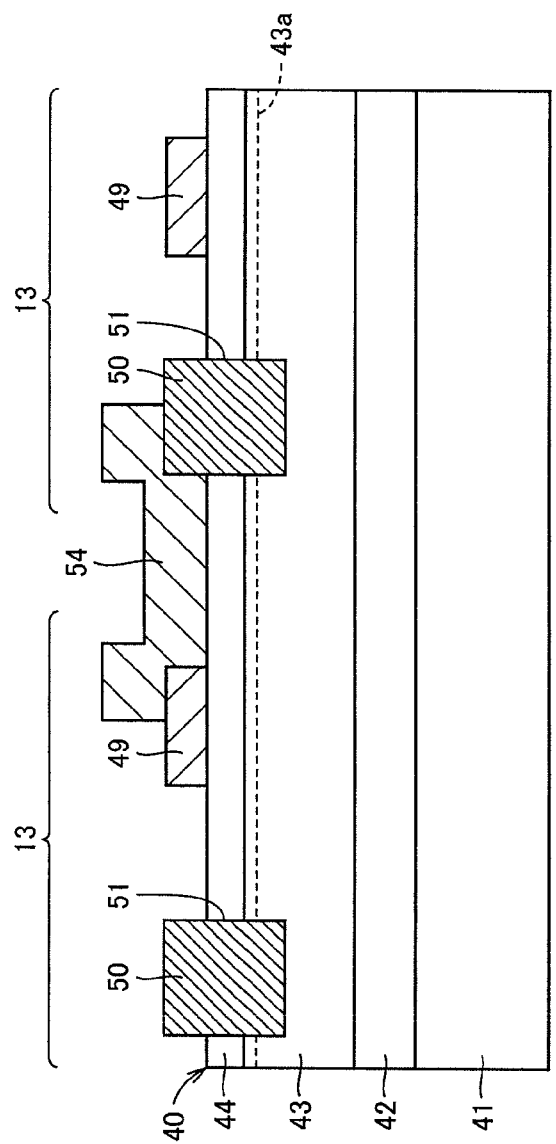
FIG. 13 is a cross-sectional view showing another structure of a semiconductor chip on which a plurality of diodes 13 shown in FIG. 6 are mounted.

As shown in FIG. 13, two diodes 13 may be connected in series by forming metal interconnection 54 from cathode electrode 49 of first diode 13 to anode electrode 50 of second diode 13, without providing groove 52 and insulating film 53.

Figure 14:
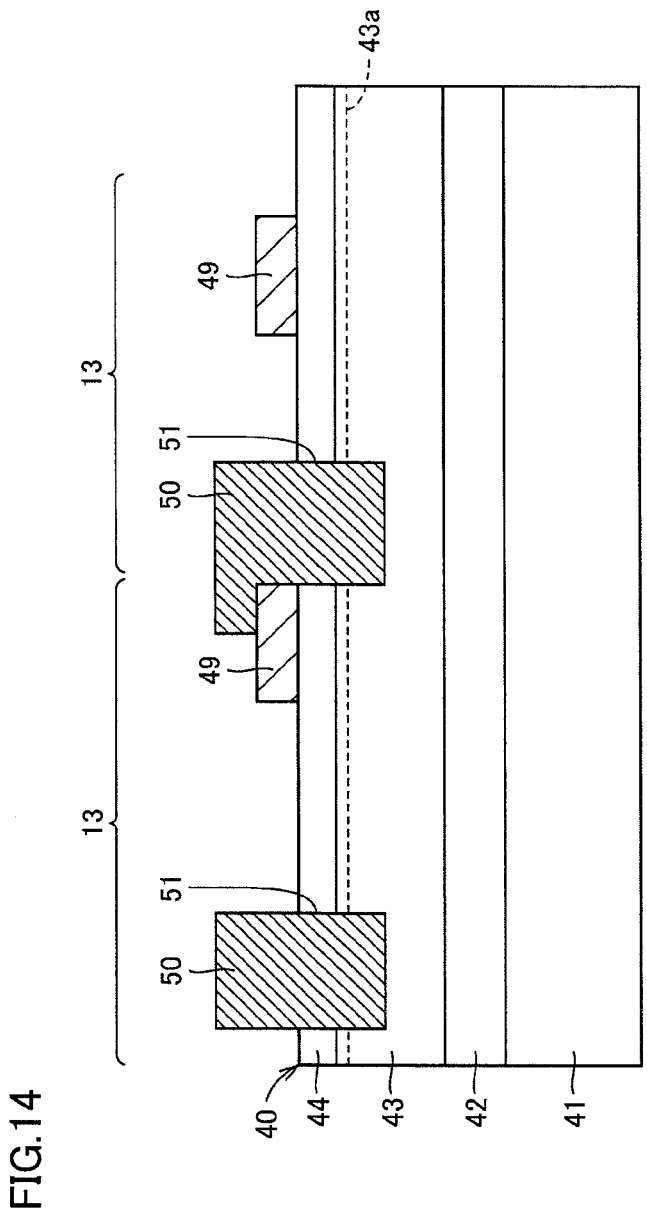
FIG. 14 is a cross-sectional view showing yet another structure of a semiconductor chip on which a plurality of diodes 13 shown in FIG. 6 are mounted.

Alternatively, as shown in FIG. 14, metal interconnection 54 may also be obviated, two diodes 13 may be arranged proximate to each other, and anode electrode 50 of second diode 13 may be formed from the end portion of cathode electrode 49 of first diode 13 to recess portion 51. Thus, cathode electrode 49 of first diode 13 and anode electrode 50 of second diode 13 are directly connected to each other.

Alternatively, transistor 11 may be eliminated from semiconductor chip 40 and only N diodes 13 may be mounted on semiconductor chip 40.

In the examples in FIGS. 7 to 14, a barrier layer of transistor 11 and diode 13 is formed of $Al_{0.25}Ga_{0.75}N$, however, composition is not limited thereto and a barrier layer may be formed of AlGaN, GaN, InGaN, or AlGaInN. Alternatively, a barrier layer having a multi-layered structure may be formed by stacking an AlGaN layer and an AlN layer.

Though a channel layer of transistor 11 and diode 13 is formed of GaN, composition is not limited thereto and a channel layer may be formed of AlGaN, GaN, InGaN, or AlGaInN. Alternatively, a channel layer having a multi-layered structure may be formed by stacking a GaN layer and an AlGaN layer.

Though the source electrode and the drain electrode of transistor 11 and the cathode electrode of diode 13 are formed of Hf/Al/Hf/Au (a stack of an Hf layer, an Al layer, an Hf layer, and an Au layer), they may naturally be formed of other electrode materials such as Ti/Al, Ti/Au, and Ni/Au.

Though the gate electrode of transistor 1 and the anode electrode of diode 3 are formed of WN/W (a stack of a WN layer and a W layer), they may naturally be formed of other electrode materials such as Ni/Au, Ti/Au, Ti/Al, Pd/Au, Pt/Au, and WSix.

Figure 15:
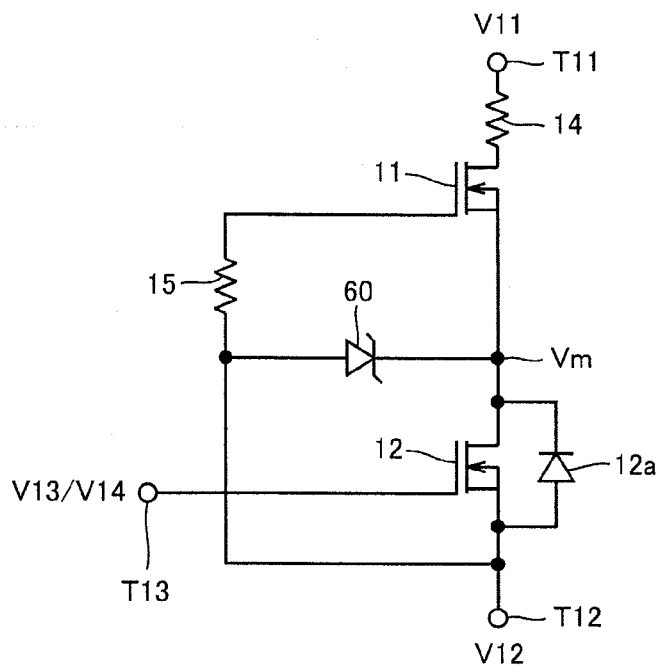
FIG. 15 is a circuit diagram showing a comparative example of the second embodiment.

FIG. 15 is a circuit diagram showing a comparative example of the second embodiment, which is compared with FIG. 6. A composite semiconductor device in FIG. 15 is different from the composite semiconductor device in FIG. 6 in that N diodes 13 are replaced with a Zener diode 60. A cathode and an anode of Zener diode 60 are connected to the drain and the source of transistor 12, respectively. A Zener voltage of Zener diode 60 is set to prescribed voltage Vc1 above.

Figure 16:
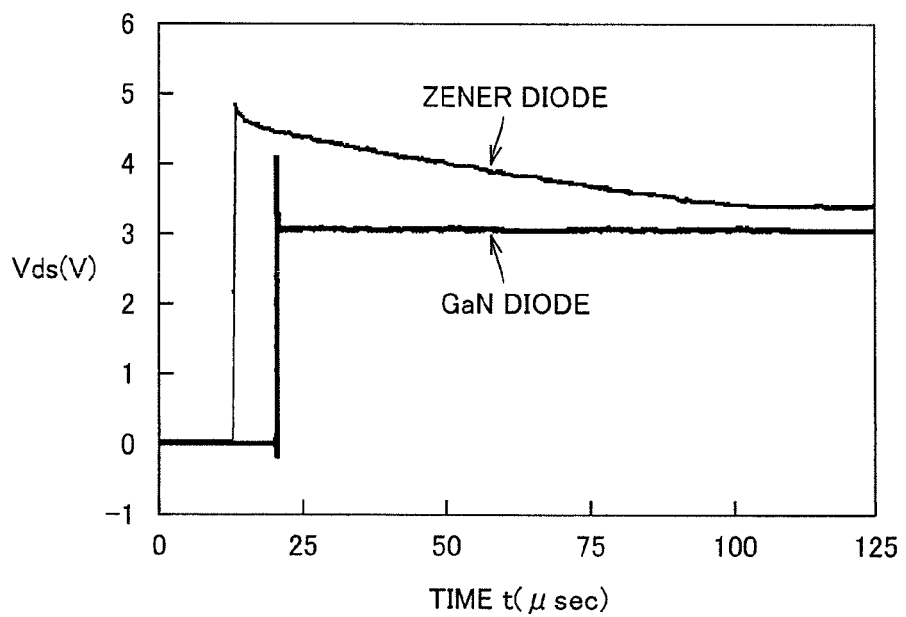
FIG. 16 is a diagram for comparing an operation between the invention of the present application and the comparative example.

FIG. 16 is a time chart for comparison between an operation of the composite semiconductor device in FIG. 6 and an operation of the composite semiconductor device in FIG. 15. A recess GaN Schottky barrier diode was employed as diode 13. In each composite semiconductor device, 150 V was applied as supply voltage V11, and drain-source voltage Vds of transistor 12 at the time when the voltage of gate terminal T13 was switched from voltage at the "H" level V14=10 V to voltage at the "L" level V13=0 V was measured.

As can be seen in FIG. 16, in the composite semiconductor device including the recess GaN Schottky barrier diode, a peak voltage of Vds is suppressed to be lower than in the composite semiconductor device including the Zener diode. In addition, a time period from start of rise of Vds until settlement thereof in a steady state (hereinafter referred to as an operation time period) is significantly shortened.

Figure 17:
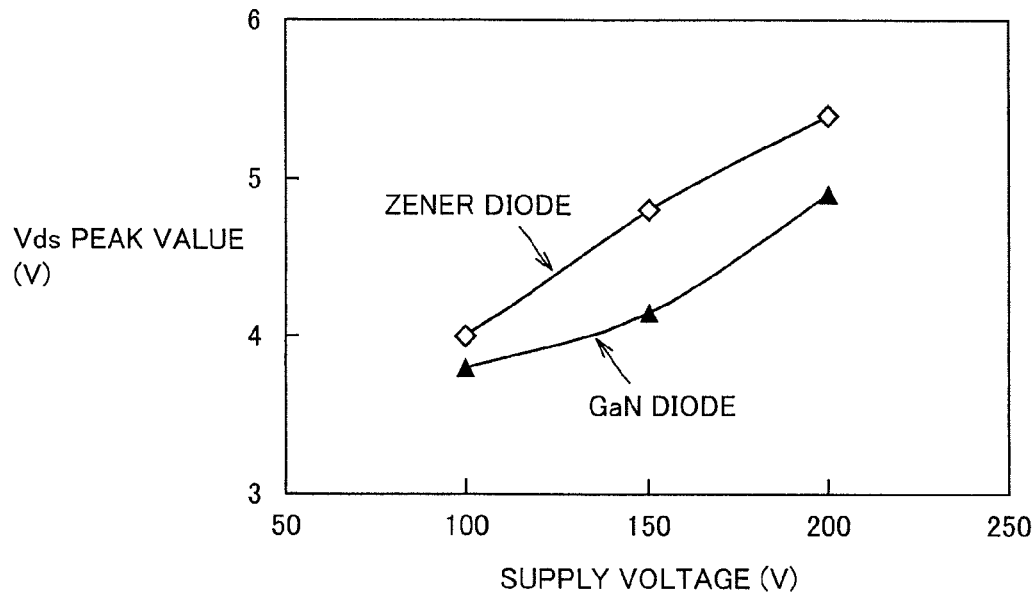
FIG. 17 is another diagram for comparing an operation between the invention of the present application and the comparative example.
Figure 18:
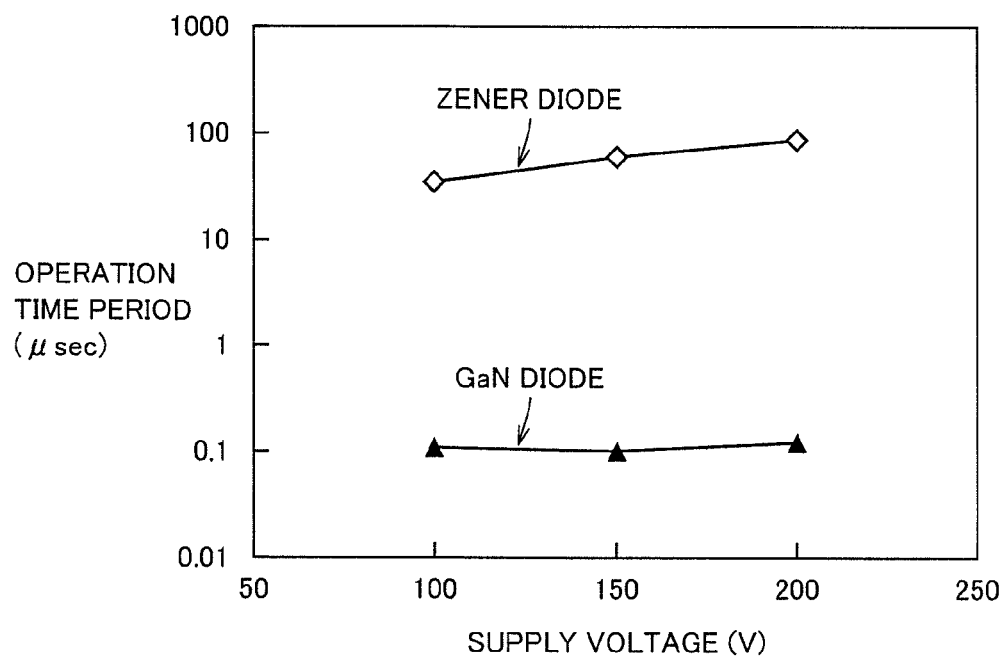
FIG. 18 is yet another diagram for comparing an operation between the invention of the present application and the comparative example.

Measurement as in the case of 150 V was conducted by applying 100 V, 200 V as supply voltage V11 to drain terminal T11. FIG. 17 shows relation between supply voltage V11 and a peak value of Vds, and FIG. 18 shows relation between supply voltage V11 and an operation time period. It can be seen in these FIGS. 17 and 18 that the Vds peak value and the operation time period are both suppressed to be smaller in the composite semiconductor device including the recess GaN Schottky barrier diode than in the composite semiconductor device including the Zener diode. This fact shows that a response speed of the recess GaN Schottky barrier diode is higher than a response speed of the Zener diode.

Therefore, the composite semiconductor device including the recess GaN Schottky barrier diode can reliably prevent sudden increase in drain-source voltage Vds of transistor 12 and breakdown of transistor 12, and can reliably prevent breakdown of transistor 12 resulting from application of a high voltage across the drain and the source of transistor 12 for a long time.

It should be understood that the embodiments disclosed herein are illustrative and non-restrictive in every respect. The scope of the present invention is defined by the terms of the claims, rather than the description above, and is intended to include any modifications within the scope and meaning equivalent to the terms of the claims.

REFERENCE SIGNS LIST

T1, T11 drain terminal; T2, T12 source terminal; T3, T13 gate terminal; 1, 11 normally-on field effect transistor; 2, 12 normally-off field effect transistor; 3, 12a, 13 diode; 4, 60 Zener diode; 20, 30, 40 semiconductor chip; 21, 31, 41 semiconductor substrate; 22, 32, 42 buffer layer; 23, 33, 43 channel layer; 43a channel; 24, 34, 44 barrier layer; 25, 46 gate electrode; 26, 47 source electrode; 27, 48 drain electrode; 35, 49 cathode electrode; 36, 50 anode electrode; 37, 51 recess portion; 45, 52 groove; 53 insulating film; and 54 metal interconnection.

The invention claimed is:
1. A composite semiconductor device, comprising:
a first terminal receiving a first voltage;
a second terminal receiving a second voltage lower than said first voltage;
a third terminal selectively provided with any one of a third voltage and a fourth voltage higher than the third voltage;

a normally-on first field effect transistor having a drain connected to said first terminal and a gate connected to said second terminal;

a normally-off second field effect transistor having a drain connected to a source of said first field effect transistor, a source connected to said second terminal, and a gate connected to said third terminal, rendered non-conductive when said third voltage is provided to said third terminal, and rendered conductive when said fourth voltage is provided to said third terminal; and a protection circuit connected in parallel to said second field effect transistor, for protecting said second field effect transistor by maintaining a voltage across the drain and the source of said second field effect transistor to a voltage not higher than a withstand voltage of said second field effect transistor, said protection circuit including N (N being a natural number) unipolar rectifier elements connected in series between the drain and the source of said second field effect transistor in a forward direction and rendered conductive when a voltage across the drain and the source of said second field effect transistor exceeds a predetermined voltage not higher than a withstand voltage of said second field effect transistor.

2. The composite semiconductor device according to claim 1, wherein in a case where a voltage of said third terminal varies from said fourth voltage to said third voltage, a time period from start of increase in voltage across the drain and the source of said second field effect transistor until conduction of said N unipolar rectifier elements is set to at most half a time period from start of increase in voltage across the drain and the source of said second field effect transistor until non-conduction of said first field effect transistor.

3. The composite semiconductor device according to claim 1, wherein each of said N unipolar rectifier elements is a Schottky diode.

4. The composite semiconductor device according to claim 3, wherein each of said N unipolar rectifier elements is formed of a material greater in energy band gap than Si.

5. The composite semiconductor device according to claim 4, wherein said material is $Al_xGa_{1-x}N$ ($0 \leq x \leq 1$), SiC, diamond, $Al_xGa_{1-x}As$ ($0 \leq x \leq 1$), $In_xGa_{1-x}P$ ($0 \leq x \leq 1$), or $Al_xIn_yGa_{1-x-y}N$ ($0 \leq x \leq 1, 0 \leq y \leq 1, 0 \leq x+y \leq 1$).

6. The composite semiconductor device according to claim 3, comprising a first semiconductor chip including first and second nitride-based semiconductor layers successively stacked on a first semiconductor substrate, wherein said N Schottky diodes are formed in N regions on a surface of said first semiconductor chip, respectively, an anode electrode and a cathode electrode of a corresponding Schottky diode are provided at a distance from each other in each region, a recess portion penetrating said second nitride-based semiconductor layer and reaching said first nitride-based semiconductor layer is formed in each region, said anode electrode is formed in said recess portion, and said cathode electrode is formed on a surface of said second nitride-based semiconductor layer.

7. The composite semiconductor device according to claim 6, comprising a second semiconductor chip including third and fourth nitride-based semiconductor layers successively stacked on a second semiconductor substrate, wherein said first field effect transistor is formed on a surface of said second semiconductor chip, a gate electrode, a source electrode, and a drain electrode of said first field effect transistor are formed on a surface of said fourth nitride-based semiconductor layer, and the gate electrode is provided between the source electrode and the drain electrode.

8. The composite semiconductor device according to claim 7, wherein said third nitride-based semiconductor layer is formed of GaN, and said fourth nitride-based semiconductor layer is formed of $Al_xGa_{1-x}N$ ($0 < x \leq 1$).

9. The composite semiconductor device according to claim 3, comprising a semiconductor chip including first and second nitride-based semiconductor layers successively stacked on a semiconductor substrate, wherein said N Schottky diodes are formed in N first regions on a surface of the semiconductor chip, respectively, said first field effect transistor is formed in a second region on the surface of said semiconductor chip, an anode electrode and a cathode electrode of a corresponding Schottky diode are provided at a distance from each other in each first region, a recess portion penetrating said second nitride-based semiconductor layer and reaching said first nitride-based semiconductor layer is formed in each first region, said anode electrode is formed in said recess portion, said cathode electrode is formed on a surface of said second nitride-based semiconductor layer, a gate electrode, a source electrode, and a drain electrode of said first field effect transistor are formed on the surface of said second nitride-based semiconductor layer in said second region, and the gate electrode is provided between the source electrode and the drain electrode.

10. The composite semiconductor device according to claim 9, wherein said first nitride-based semiconductor layer is formed of GaN, and said second nitride-based semiconductor layer is formed of $Al_xGa_{1-x}N$ ($0 < x \leq 1$).

11. The composite semiconductor device according to claim 1, further comprising a first resistor element interposed between the gate of said first field effect transistor and said second terminal.

12. The composite semiconductor device according to claim 1, further comprising a second resistor element interposed between said first terminal and the drain of said first field effect transistor.

* * * * *